United States Patent [19]
Seidler

[11] Patent Number: 5,310,367
[45] Date of Patent: May 10, 1994

[54] SOLDERABLE LEADS

[75] Inventor: Jack Seidler, Flushing, N.Y.

[73] Assignee: North American Specialties Corporation, Flushing, N.Y.

[21] Appl. No.: 58,938

[22] Filed: May 7, 1993

[51] Int. Cl.$^5$ .................. H01R 4/02; H01R 9/09
[52] U.S. Cl. ................... 439/876; 439/885; 29/884
[58] Field of Search .......... 439/83, 876, 885; 29/884

[56] References Cited

U.S. PATENT DOCUMENTS 4,466,689  8/1984  Davis et al. ............ 439/885 X
4,737,115  4/1988  Seidler .................... 439/83
5,030,144  7/1991  Seidler .................... 439/876

Primary Examiner—Eugene F. Desmond
Attorney, Agent, or Firm—Darby & Darby

[57] ABSTRACT

A solderable lead structure adapted for joining or soldering to a substrate carrying electrical components, comprising a double comb-like configuration made of conductive material, having two rows of contact strips or leads that are connected to opposite edges of a common carrier strip. At the free or distal ends of the leads, individual clips are formed for resiliently engaging both sides of a substrate. The leads extend from the carrier strip from opposite edges and are then folded to result in a linear, intermeshed arrangement.

26 Claims, 3 Drawing Sheets

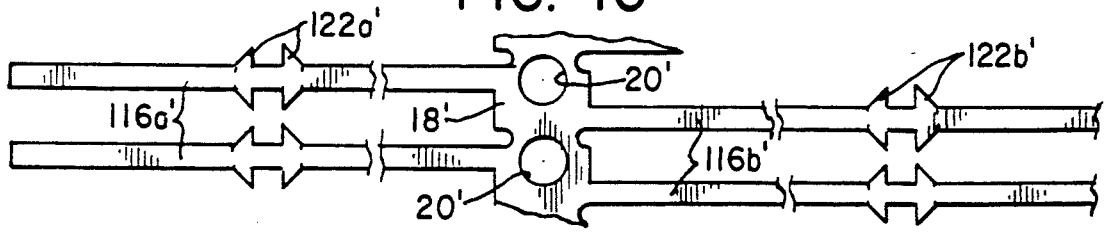
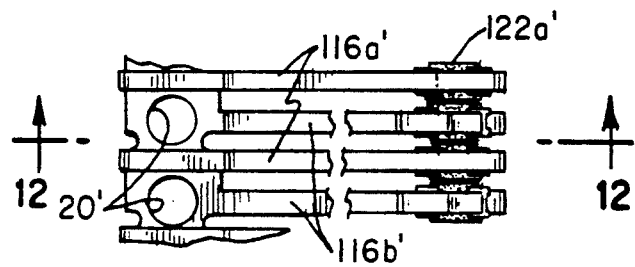
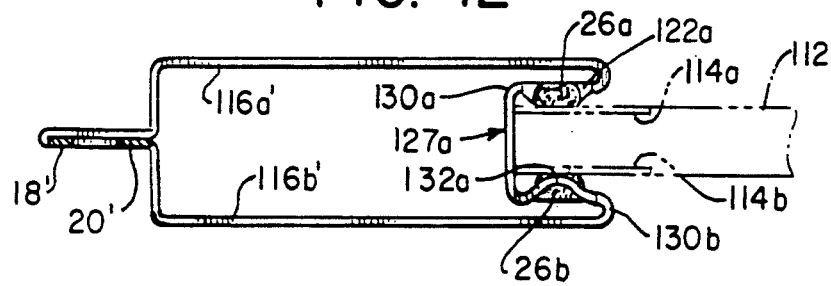
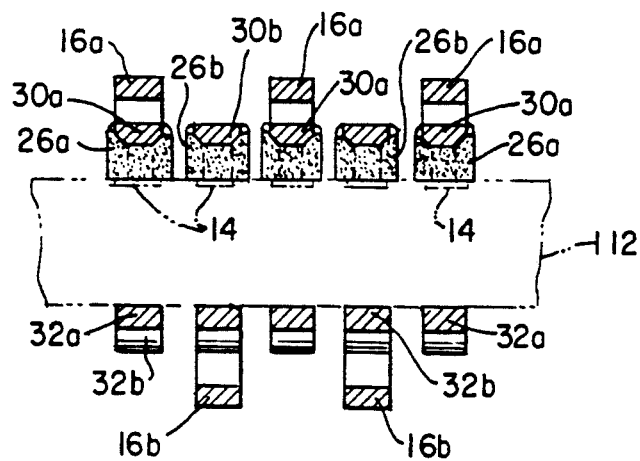

SOLDERABLE LEADS

FIELD OF THE INVENTION

The present invention relates to a solderable lead construction for attachment to a substrate or circuit-bearing board and more particularly to an improved solderable lead construction and method of attaching and holding such a lead construction to multiple contact pads on a substrate prior to and during the soldering of the leads to the board.

BACKGROUND OF THE INVENTION

Leads for substrates that are pushed onto an edge of the substrate have been formed with a spring clip on each lead, which engages the top and bottom surfaces of the substrate to hold the lead in its desired location. Resilient fingers of the clip grip opposing sides of the substrate by spring tension between the lead and the substrate, with the lead in contact with a conductive area or contact pad on the substrate. One or both of the fingers of each lead may hold a solder mass, to be positioned at the contact pad, to which it becomes soldered upon application of heat and subsequent cooling. Such arrangements are shown in the prior art illustrated by U.S. Pat. Nos. 4,605,278; 4,597,628; 4,679,889; 4,697,865 and 4,428,305 of the present inventor.

Certain difficulties have been associated with the prior art applications of leads to substrates which are overcome or avoided by the present invention. Some substrates have contact pads on one surface of a substrate that are closely spaced. Other substrates have sets of contact pads adjacent the substrate edge on both opposing surfaces of the substrate, with the two sets of contact pads offset from each other, i.e. a contact pad on one side is between two pads on the opposing surface along the edge of the substrate. With the present trend toward having more and more leads attached to a substrate, leads to be attached to the substrate must have extremely close spacing between adjacent leads. Desirable known constructions for holding solder to a lead have tabs that initially extend laterally from the side edges of the leads and are then bent to hold the solder. With conventional lead arrangements, the lead spacing becomes too close to allow for these laterally extending solder-holding structures.

One arrangement that has partially solved these problems is shown in U.S. Pat. No. 4,737,115 of the present inventor. In that patent, two sets of leads are formed to extend from opposite edges of a central carrier strip. Once folded over, the leads become interleaved to form a single row of leads. The solder is held on the lead tip without the laterally extending structures. By applying pressure to the leads, the two sets of leads separate to receive a substrate edge between them, suitable for substrates with staggered contact pads on opposed faces. This arrangement partially avoids the described problem by eliminating the laterally extending tabs, but does not permit taking advantage of the desirable features of the lateral tabs. Further, this arrangement can not be used with closely spaced contact pads on the same substrate surface.

There also exists a need for a solderable lead construction that is both easy to manufacture as well as being easy to assemble onto multiple contact pads of a substrate with stable retention on the substrate during a soldering process.

SUMMARY OF THE INVENTION

The present invention overcomes these and other deficiencies of the prior art by providing a lead construction and arrangement specially adapted for joining leads to a substrate carrying electrical components, comprising a double comb-like configuration made of conductive material, having two rows of contact strips or leads that are each connected to opposite edges of a common carrier strip intermediate the two rows. At the free or distal ends of the leads, individual clips are formed for resiliently engaging both sides of a substrate, so that the leads may be firmly attached mechanically to the substrate, at the positions of contact pads on the substrate. The leads extend from the carrier strip from opposite edges and are then folded to result in a linear arrangement of parallel leads. This allows for solder-holding structures to be formed along the edges of each lead without interfering with adjacent leads. The clips also improve the mechanical connection between the leads and the substrate during the soldering operation. Since each clip abuts both surfaces of the substrate, close spacing of contact pads on a single substrate surface can be accommodated, as well as other configurations, such as contact pads either staggered or aligned on both substrate surfaces.

The leads and carrier strip may be readily fabricated by progressive stamping techniques from a continuous roll of sheet or strip material. Individual lengths may be cut from such a roll as required in conformance to the number of contact pads on the substrate to which the leads are to be attached; that is, the number of leads in each such length is correlated to the number of contact pads on the substrate to which the leads are to be attached.

The present invention therefore permits automated and rapid assembly of leads to an edge of a circuit board or other substrate, in register with the contact pads on the substrate, by simultaneously applying a plurality of leads to the substrate, in a single operation.

The construction and arrangement of the present invention has the advantage of being relatively easy to manufacture by customary stamping processes, and is simple to assemble simultaneously to numerous contact pads on the substrate.

Accordingly, it is an object of the present invention to provide an improved solderable lead for attachment to contact pads on a substrate such as circuit-bearing printed circuit boards and the like.

A further object of the present invention is to provide an improved solderable lead arrangement having a double comb-like configuration including lead strips which each have a clip for resiliently attaching to a substrate.

It is yet another object of the present invention to provide an improved lead configuration permitting a closely spaced lead relationship.

BRIEF DESCRIPTION OF THE DRAWINGS

These and other objects and advantages of the present invention will become apparent to those skilled in the art from the following detailed description of the preferred embodiments in conjunction with a review of the appended drawings, in which:

FIG. 5 is a cross-section view taken along the line 5—5 of FIG. 4;

FIG. 10 is a top plan view of a portion of a partially formed blank of a comb-like array of clip leads according to a second alternate embodiment of the invention;

FIG. 11 is a top plan view of a fragment of a completed array of leads according to the second alternate embodiment; and FIG. 12 is a cross-section view taken along the line 12—12 of FIG. 11.

DETAILED DESCRIPTION OF THE PREFERRED EMBODIMENTS

Figure 1:
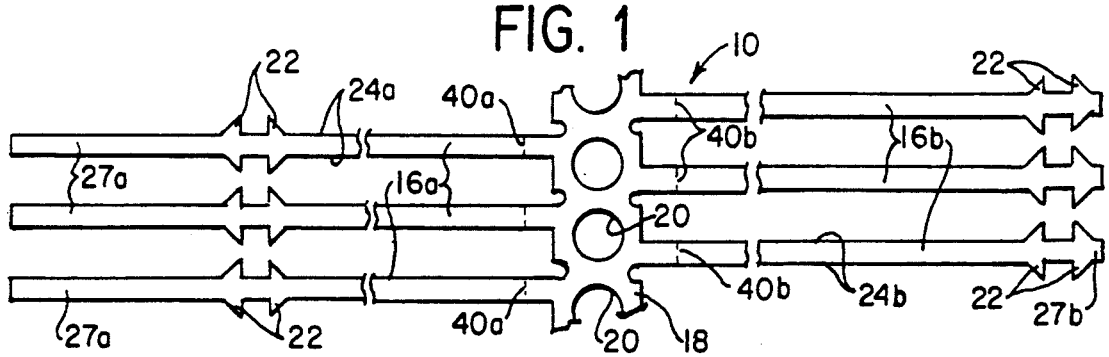
FIG. 1 is a top plan view of a portion of a partially formed blank of a comb-like array of clip leads for a preferred embodiment of the invention.

Referring now to the drawings, where like parts are designated by the same reference numeral throughout the several views, there is shown a preferred embodiment in FIGS. 1-5 comprising an electrical contact lead structure 10 which is adapted to be electrically connected to a substrate 12. The substrate preferably includes electrical components and conductors connected to electrically conductive areas or contact pads 14 near the edge of the substrate. In the type of substrate to which a preferred embodiment is particularly directed, the contact pads 14 are in closely spaced consecutive arrangement on one surface of the substrate 12.

The structure is formed from a blank which shown in partially fabricated form in FIG. 1. The blank essentially comprises a flat strip of conductive resilient material, such as beryllium copper, formed into a double comb configuration with two rows of contact lead strips 16a,16b, extending outwardly from a common carrier strip 18.

The spacing or pitch between strips 16a,16b of each of the rows is preferably equal to twice the pitch of the contact pads 14 on the substrate 12. The carrier strip 18 has a plurality of indexing holes 20 disposed along its length for use in moving or indexing the blank during fabrication. The leads 16a,16b and carrier strip 18 are preferably formed by continuously and progressively stamping from a thin elongated strip of metal. During the stamping, tabs 22 are preferably formed on the side edges 24a,24b of the individual strips, the tabs 22 being used to retain solder to the completed leads 16a,16b as shown in U.S. Pat. No. 4,737,115 of the present inventor. Other types of tabs and fingers may be stamped into or struck from the leads to hold a desired solder mass, as is known.

Figure 2:
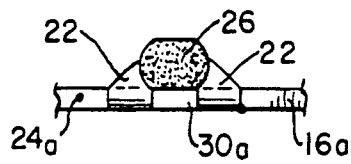
FIG. 2 is a fragmentary side view of a solder-bearing portion of one of the leads of the preferred embodiment.

In the preferred embodiment, the tabs 22 are bent along the side edges 24, out of the plane of the leads 16 and staked into a solder mass 26, as shown in FIG. 2.

Figure 3:
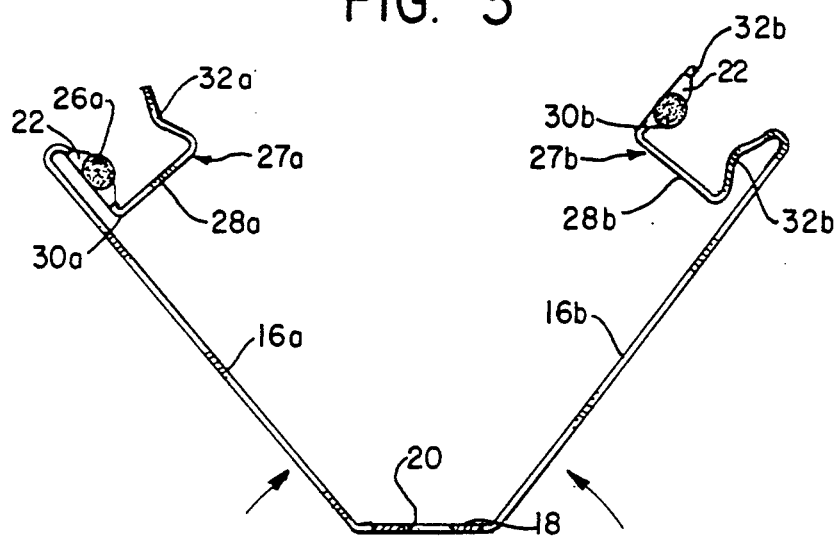
FIG. 3 is a side cross-section view of an array of leads during an intermediate stage of manufacture.
Figure 4:
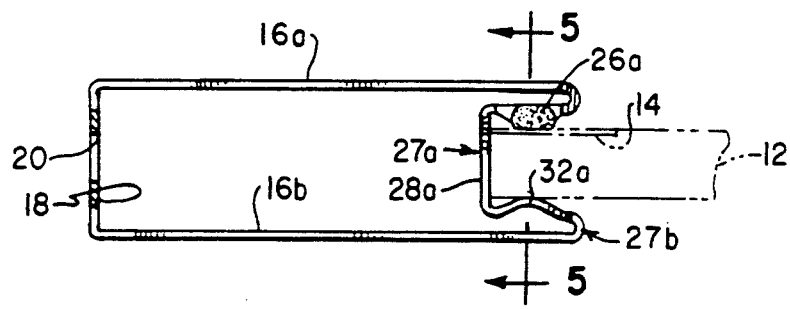
FIG. 4 is a side cross-section view of a completed array of leads according to the preferred embodiment, in relationship to a substrate.
Figure 6:
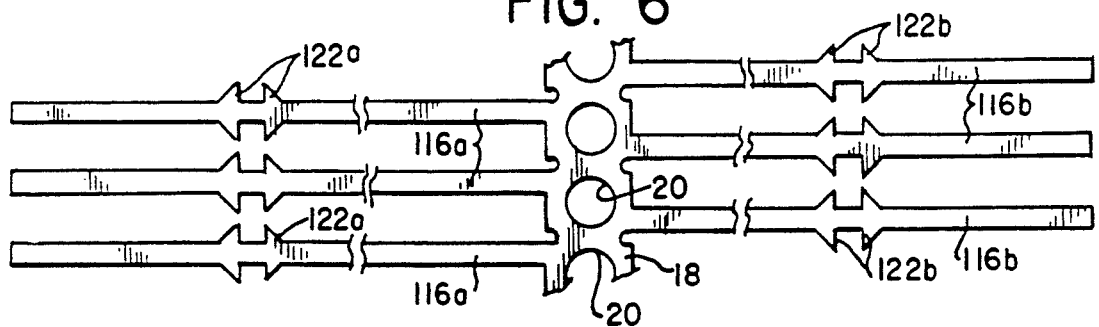
FIG. 6 is a top plan view of a portion of a partially formed blank of a comb-like array of clip leads for an alternate embodiment of the invention.

To retain each solder mass 26a,26b and lead 16a,16b in place against a respective contact pad 14 on the substrate 12 during soldering, the 27a or 27b of each strip is bent into a clip 28a,28b, as shown in FIG. 3. When mounted onto the substrate 12, as shown in FIGS. 4 and 5, the solder-bearing arm 30a,30b of the clip 28a,28b will abut the contact pads 14, while the opposite arm 32a,32b of clip 28a,28b will abut a non-conductive area of the opposite surface of the substrate 12. The non-solder-bearing arm 32a,32b is preferably angled toward the solder-bearing arm 30a,30b to resiliently retain the substrate 12 between the arms. The extreme distal end of the opposite arm 32a,32b is also preferably bent to form a divergent opening, into which the substrate 12 may be easily inserted.

It will be understood that a length of the structure of FIG. 4, having a number of leads corresponding to the number of contact pads 14 on the substrate 12, is joined simultaneously to the substrate, with the clips 28a,28b gripping the substrate with the solder masses 26a,26b in contact with respective pads 14. The clips then hold the assembly mechanically together for further processing. In the final stages of fabrication, each solder mass 26a,26b is held against one of the contact pads 14, and all are heated to melt the solder, and then cooled to form an electrical and mechanical bond between the respective lead and the abutting contact pad 14. With each individual lead 16a,16b and its integral clip 28a,28b applying an independent retention force against the substrate 12, the opportunity for accidental movement of the substrate during soldering is diminished. This provides an improved method of assembly and mechanical bond between the leads and substrate compared to other known structures.

As seen in FIG. 5, for example, the contact pads 14 on the substrate 12 are consecutive along a single surface of the substrate. To create a comb like array of clip leads to engage these closely spaced contact pads that only extended from one side of a carrier strip, the leads would need to be extremely close together. This would prohibit including the tabs 22 or other solder-holding structures on the sides 24 of the lead strips 16. Therefore, the leads 16a,16b are staggered on alternate edges of the carrier strip 18, formed into clip leads (see FIGS. 2 and 3) and bent out of the plane of the carrier strip 18 (see FIG. 3) so that after the solder masses 26a,26b are applied and held by bending up the tabs 22, the clips 28a,28b of adjacent leads become intermeshed in a linear arrangement (see FIGS. 4 and 5).

Once the clips 28a,28b and hardened solder 26a,26b have formed electrical and mechanical bonds with the substrate 12, the carrier strip 18 may be cut from the leads 16a,16b leaving the leads 16 extending outward from the edge of the substrate 12 for subsequent connection to surrounding circuitry. Each individual lead 16a,16b will be connected to a single contact pad 14. If desired, additional bends can be formed in one half of the leads (16b, for example) so that the two sets of leads will be co-planar as well as parallel as they extend from the substrate edge.

The leads 16a,16b are preferably provided with score grooves or notches 40a,40b adjacent the carrier strip 18, which permit the leads 16a,16b to be readily detached from the carrier strip 18 by one or more cutting strokes after soldering. The leads 16a,16b may then be suitably connected to other electrical circuit elements as desired.

Figure 7:
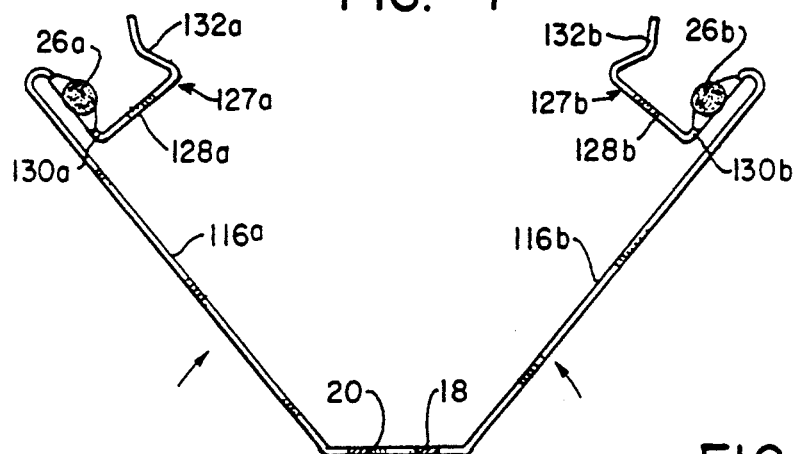
FIG. 7 is a side cross-section view of an array of leads according to the alternate embodiment during an intermediate stage of manufacture.
Figure 9:
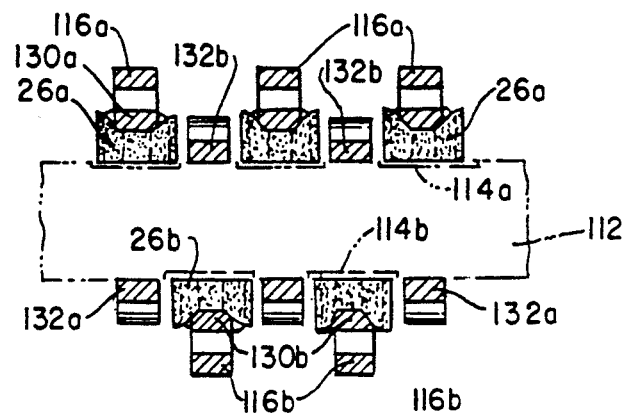
FIG. 9 is a cross-section view taken along the line 9—9 of FIG. 8.

In an alternate embodiment of the present invention the contact pads 114a on one face of the substrate 112 may be staggered and interleaved with respect to the pads 114b on the opposite face of substrate 112 (see FIG. 9). In this configuration, the solder masses 26 would be formed on the clip arms abutting the contact pads 114a,114b. This can be achieved by reversing the roles of the two arms 130b,132b of the clips in one row of leads 116b. For example, the non-solder-bearing arm 132b and the solder-bearing arm 130b of one row of leads (See FIG. 7) are interchanged, relative to the corresponding arm positions in FIG. 3

In this embodiment, the spacing between strips 116a,116b of each of the rows is preferably equal to the pitch of the contact pads 114a,114b on a corresponding side of the substrate 112. The carrier strip 18 and side tabs 122a,122b are essentially the same as the tabs in the above first embodiment, except that the tabs 122b of the strips 116b are at a different position along the strips 116b.

Figure 8:
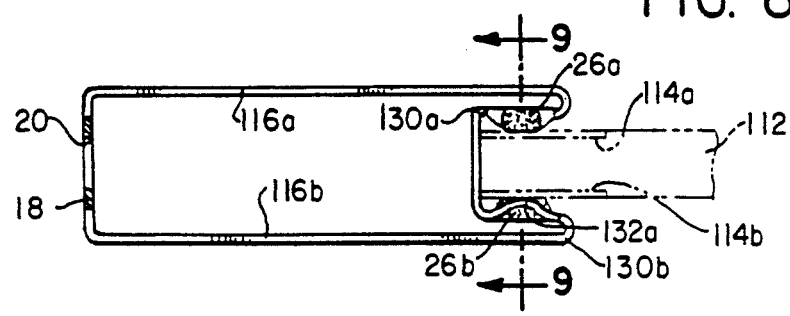
FIG. 8 is a side cross section view of a complete array of leads according to the alternate embodiment, in relationship to a substrate.

When mounted onto the substrate 112, as shown in FIG. 8 and 9, the solder-bearing arm 130a,130b of the clip 128 will abut one of the contact pads 114a,114b, while the opposite arm 132a,132b of the clip 128a,12-8%i b %1 will abut a non-conductive area of the opposite surface of the substrate 112. If the size and spacing of the contact pads 114a,114b causes a significant probability of incidental contact with the adjacent clip arm, the opposite non-solder-bearing clip arm 132a,132b may be coated with a non-conductive material, as described in Application Ser. No. 07/762,900 of the present inventor.

A second alternate embodiment of the invention is shown in FIGS. 10–12, in which like elements are indicated with like reference numerals to the embodiments of FIGS. 1–9. The major difference between the embodiment of FIGS. 6–9 and the embodiment of FIG. 10–12 is the final configuration of the carrier strip 18' once the two rows of lead strips 116a',116b' have been formed into clip leads and bent to form an intermeshed comb-like array of leads.

In this embodiment, the leads 116a' in one of the rows are preferably slightly longer than the leads 116b' of the other row. As seen in FIG. 12, the row with the shorter leads 116b' extends from the carrier strip 18' perpendicularly and then has a further right angle bend to extend toward the substrate 112. The row of longer leads 116a'60 is folded onto the carrier strip 18' so that a portion 134 of the leads 116a' overlies the carrier strip 18'. The leads 116a' are then bent with two right angles to extend toward the substrate 112.

It will be understood that the carrier strip 18' may be positioned at any position between leads 116a',116b' as seen in FIG. 12, or coplanar with either one of leads 116a',116b'. Once the leads 116a',116b' extend away from the carrier strip 18' toward the substrate 112, the structure of the leads 116a',116b' is identical to that of the embodiment of FIGS. 6–9.

As a further alternative, not shown in the drawings, both arms 32a, 30a and 32b, 30b of the clips 28a, 28b may be formed with tabs 22, so that solder is held on both arms of each clip. This permits securement to substrates having aligned contact pads on both surfaces of the substrate. In this form, the leads will connect the circuits on both surfaces of the substrate, or else if the contact pad on one substrate surface has no circuit connected to it, the lead is soldered to an unconnected pad, which serves the purpose of providing a stronger retention of the lead to the substrate.

While the embodiments have been described above as having a solder mass 26 at the clip end of the leads, that is not essential. It is within the contemplation of the present invention for solder to be applied separately, as by a wave-soldering or dip-soldering technique, after the lead has been attached to the respective substrate. The resiliency of the clip arms will retain the multi-lead configuration attached to the substrate through subsequent soldering operations, which may be of conventional type.

Thus, it will be seen that the present invention provides a double comb-like array of leads, with two sets of leads extending from opposite edges of a carrier strip, each of the leads having a solder mass mounted on a clip structure at the distal end. The array is arranged for attachment to conducting areas on one surface or on the top and bottom surfaces of a substrate. Once the substrate is moved into the area between the arms of the clips, the clips will maintain contact with the contact pads during subsequent soldering operations.

It should be understood that the present invention is subject to many variations, modifications and changes in detail. However, it is intended that all matter contained in the foregoing description or shown in the accompanying drawings shall be interpreted as illustrative only and not in a limiting sense, the scope of the invention being defined by the appended claims.

What is claimed is:

1. A solderable lead structure adapted to be attached to a substrate having an array of conductive areas on a surface thereof, said substrate having two opposed surfaces, comprising:
   a main body of conductive material having first and second edges;
   a first set and a second set of leads, said first set extending from said first body edge and said second set extending from said second body edge, each of said leads within said sets having a proximal end attached to said body and a free end extending away from said body, each lead of one set being adjacent a respective lead of the other set; and
   clip means formed on each of said leads for resiliently retaining said leads in engagement with said substrate, said clip means for each lead being integral with the free end of said lead, said clip means having two arms, one of said arms being adapted to abut one of said substrate surfaces while the other of said arms is adapted to abut the other surface of said substrate.

2. A solderable lead structure as in claim 1, wherein each of said leads includes a solder mass positioned on said one of said arms to abut said conductive areas.

3. A solderable lead structure as in claim 2, wherein said leads further comprise means for retaining said solder to said one of said arms, each of said leads having lateral edges, said means for retaining extending from said lateral edges.

4. A solderable lead structure adapted to be attached to a substrate having an array of conductive areas on a top surface thereof and an array of conductive areas on a bottom surface comprising:
   a main body of conductive material having first and second edges;
   a first set and a second set of leads, said first set extending from said first edge and said second set extending from said second edge, each of said leads within said sets having a proximal end attached to said body and a free end extending away from said body, said first set being adapted to abut said top surface conductive areas and said second set being adapted to abut said bottom conductive areas, each lead of one set being adjacent a respective lead of the other set; and means for resiliently retaining said substrate, said means for retaining being integral with said free end of said leads.

5. A solderable lead structure as in claim 4, wherein said means for retaining comprises a clip having two arms, one of said arms adapted to abut said top substrate surface while the other of said arms is adapted to abut said bottom surface.

6. A solderable lead structure as in claim 4, wherein each of said leads of said first set includes a solder mass positioned to abut said top surface conductive areas and each of said leads of said second set includes a solder mass positioned to abut said bottom surface conductive areas.

7. A solderable lead structure as in claim 6, wherein said main body is formed of a flat strip and wherein said first and second sets extend from said strip perpendicular to said strip.

8. A solderable lead structure as in claim 6, wherein said main body is formed of a flat strip, one of said sets being folded over said strip.

9. A solderable lead structure as in claim 8, wherein the other of said set extends from said proximal end substantially perpendicular to said strip.

10. A solderable lead structure adapted to be attached to a substrate having one or more conductive areas, comprising:

a main body portion of conductive material having a substantially double comb-like configuration including two rows of substantially parallel elongated leads, each having a lead body with a proximal end and a distal end;

a common mounting strip having two opposite edges, said leads being attached to said strip at their proximal ends, one of said rows of leads being attached to one of said strip edges;

said distal ends of said rows of leads being interleaved in a linear arrangement such that said leads are adapted to engage a single edge of the substrate;

wherein each of said leads comprises means for resiliently retaining said substrate, said means for retaining being integral with said distal ends of said leads.

11. A solderable lead structure as in claim 10, wherein said substrate has two opposite surfaces, each lead having a solder mass adapted to abut one of said opposite substrate surfaces, the solder mass of each adjacent lead being adapted to abut the other of said opposite substrate surfaces.

12. A method of fabricating a solderable lead structure adapted to be attached to a substrate having two opposed surfaces, with an array of conductive areas on at least one of said surfaces, comprising the steps of forming a flat blank having
a central carrier strip,
a first set of leads extending outwardly from said central strip in a first direction, and
a second set of leads extending outwardly from said central strip in an opposite direction,
the leads of said sets being relatively staggered with respect to one another, forming a clip at the end of at least some of said leads, each clip having a pair of generally parallel arms, and placing said clips in general alignment.

13. A method as in claim 12, comprising the steps of forming each of said leads with tabs extending laterally therefrom toward an adjacent lead of the same set;

bending said tabs generally perpendicular to said leads, inserting a solder mass between tabs on at least some of said leads, and securing each solder mass to its respective lead by staking the respective tabs to said solder mass.

14. A method as in claim 13, wherein one of said arms of at least certain of said clips includes said solder mass.

15. A method as in claim 13, wherein both of the arms of at least certain of said clips include a said solder mass.

16. A method as in claim 13 further comprising the step of:

inserting a substrate in said aligned clips,
said substrate conductive areas being juxtaposed to at least some of the solder masses of said clips,
heating said solder masses to solder said solder-bearing clip arms to said substrate conductive areas, and
thereafter severing said central strip from said leads.

17. A method as in claim 14 including the step of juxtaposing the solder-bearing clip arms of one of said sets of leads to a set of substrate conductive pads on one surface of said substrate, and juxtaposing said solder-bearing arms of the other set of leads to conductive pads on the opposite surface of said substrate.

18. A method as in claim 12 including the step of bending said arms relative to said central strip to place said clips substantially in alignment.

19. A lead arrangement on a substrate having two opposed surfaces with an array of conductive areas on at least one said surface comprising:

a lead structure as in claim 1, wherein said clip means on said leads are in substantial alignment along one edge of said substrate, with the leads of each of said sets of leads being interleaved between the leads of the other of said sets of leads.

20. A structure as in claim 19 wherein each of said leads includes a solder mass positioned on one of said clip arms of at least some of the leads of one set of leads, said solder mass of each lead being juxtaposed to a conductive pad on one surface of said substrate.

21. A structure as in claim 20 wherein at least some of said clips include a solder mass positioned on one of said clip arms, the solder masses of one of said sets of leads being juxtaposed to a first set of conductive pads on one surface of said substrate, and the solder masses of a second set of leads being juxtaposed to a second set of conductive pads on the opposite surface of said substrate.

22. A structure as in claim 21 wherein said first set of conductive pads is in staggered relation to said second set of conductive pads.

23. A structure as in claim 20 wherein a solder mass is attached to both arms of each clip, said solder masses being juxtaposed to aligned conductive pads on the opposite surfaces of said substrate.

24. A flat blank for a lead arrangement adapted to be applied to a substrates having a set of conductive pads extending along a surface thereof, comprising:

a central carrier strip having two edges,
a first set of leads extending outwardly from an edge of said central strip generally perpendicularly to said central strip, a second set of leads extending outwardly from the other edge of said central strip in the direction opposite from said first set of leads, said second set of leads being in staggered relationship with respect to said first set of leads, each of said leads having at least one tab extending laterally from each edge thereof, toward an adjoining lead of the same set.

25. A blank for a lead arrangement as in claim 24, each of the tabs of a lead being bent substantially perpendicular to the plane of its respective lead.

26. A blank for a lead arrangement as in claim 24, wherein the proximal end of at least some of said leads is bent to form a clip, with a pair of generally parallel arms, said tabs of each said lead being on one of said clip arms of the respective lead.

* * * * *